US008019015B2

(12) United States Patent
Moffatt et al.

(10) Patent No.: US 8,019,015 B2
(45) Date of Patent: Sep. 13, 2011

(54) LINEARIZATION OF RF POWER AMPLIFIERS USING AN ADAPTIVE SUBBAND PREDISTORTER

(75) Inventors: Christopher D. Moffatt, Palm Bay, FL (US); G. Patrick Martin, Merritt Island, FL (US); James Tonti, Valkaria, FL (US)

(73) Assignee: Harris Corporation, Melbourne, FL (US)

( * ) Notice: Subject to any disclaimer, the term of this patent is extended or adjusted under 35 U.S.C. 154(b) by 648 days.

(21) Appl. No.: 11/678,847

(22) Filed: Feb. 26, 2007

(65) Prior Publication Data
US 2008/0211576 A1 Sep. 4, 2008

(51) Int. Cl.
 *H04K 1/02* (2006.01)
 *H04L 25/03* (2006.01)
 *H04L 25/49* (2006.01)
(52) U.S. Cl. .................................... 375/297; 375/296
(58) Field of Classification Search ........... 375/296–297
See application file for complete search history.

(56) References Cited

U.S. PATENT DOCUMENTS

| 5,861,777 | A | | 1/1999 | Sigmon et al. |
| 5,892,397 | A | | 4/1999 | Belcher et al. |
| 5,923,712 | A | | 7/1999 | Leyendecker et al. |
| 6,078,216 | A | * | 6/2000 | Proctor, Jr. .................... 330/151 |
| 6,188,732 | B1 | | 2/2001 | Rha |
| 6,271,724 | B1 | | 8/2001 | Neffling |
| 6,337,599 | B2 | | 1/2002 | Lee |
| 6,356,146 | B1 | | 3/2002 | Wright et al. |
| 6,570,444 | B2 | | 5/2003 | Wright et al. |
| 6,794,936 | B2 | | 9/2004 | Hsu et al. |
| 6,834,084 | B2 | | 12/2004 | Hietala |
| 6,937,669 | B2 | * | 8/2005 | Tomerlin et al. .............. 375/297 |
| 7,034,614 | B2 | | 4/2006 | Robinson et al. |
| 7,142,615 | B2 | | 11/2006 | Hongo et al. |
| 2002/0114403 | A1 | * | 8/2002 | Garceran et al. .............. 375/295 |
| 2004/0217811 | A1 | | 11/2004 | Nanao et al. |
| 2005/0195919 | A1 | * | 9/2005 | Cova ............................ 375/297 |
| 2007/0093227 | A1 | * | 4/2007 | Lieback et al. ............ 455/276.1 |

FOREIGN PATENT DOCUMENTS

| EP | 1503495 A2 | 2/2005 |
| EP | 1 732 207 | 12/2006 |
| GB | 2 351 624 | 1/2001 |

* cited by examiner

*Primary Examiner* — Curtis B Odom
(74) *Attorney, Agent, or Firm* — Fox Rothschild, LLP; Robert J. Sacco

(57) ABSTRACT

Predistorting an input signal prior to amplification in an RF power amplifier (206) includes isolating a plurality sub-band signals, each representing a portion of the input signal s(t). The method includes independently modifying an amplitude and a phase of each of the plurality of sub-band signals. The modification of the amplitude and/or phase is performed using a set of signal weighting parameters (weights) w and W, controlling linear and nonlinear modifications respectively, which are determined in an adaptive process by an adaptive controller (224). After modification, each of the sub-bands are summed together to obtain a predistorted input signal for an RF power amplifier (206).

17 Claims, 4 Drawing Sheets

LINEARIZATION OF RF POWER AMPLIFIERS USING AN ADAPTIVE SUBBAND PREDISTORTER

BACKGROUND Of THE INVENTION

1. Statement of the Technical Field

The inventive arrangements relate to methods for linearizing RF power amplifiers, and more particularly to a method for providing an envelope elimination and restoration (EER) amplifier with enhanced linearity.

2. Description of the Related Art

Power amplifiers are inherently nonlinear devices and are used in virtually all communications systems. Long-range communications require nigh-power amplifiers that are by far the most power consuming devices in the entire system. Amplifier efficiency is measured as the ratio of output power to the required DC power consumption. It is well known that very efficient power amplifiers are highly nonlinear. Highly efficient amplifiers are critical to mobile communications systems that require low power consumption for increased battery life and reduced size, such as cell phones, laptops, and military radios.

High-efficiency amplifiers with nonlinearities cause spectral re-growth (out-of-band noise), which leads to adjacent channel interference. They also cause in-band distortion, which degrades the bit-error rate (BER) performance for digital modulation waveforms. This degradation in performance has become a critical issue over the recent years as new emerging high-data rate digital waveforms are being used for transmission. Linearization is necessary to comply with FCC spectral mask requirements, to reduce BER, and to achieve acceptable amplifier efficiency, Predistortion can be used to convert a nonlinear amplifier into a linear amplifier.

Distortion associated with RF power amplifiers is often characterized by means of an amplitude-to-amplitude (AM-to-AM) modulation curve and an amplitude-to-phase (AM-to-PM) modulation curve. The AM-to-AM modulation curve shows the RF power amplifier gain as a function of the input power. The AM-to-PM modulation curve shows the output phase variation of the RF power amplifier as a function of the input power. It should foe understood that AM-to-AM distortion and AM-to-PM distortion can adversely affect the performance of an RF communication system, Digital baseband predistortion is a cost effective technique that applies a correction to the input signal that is complementary to the distortion caused by the amplifier. The predistorter precedes the power amplifier (PA) and creates the inverse amplifier nonlinearity. A perfectly linear PA output would simply be a scalar multiple of the input signal to the PA (i.e. $y=G*x$, where G is the amplifier's gain). Because the amplifier "adds" distortion to the input signal, the output may he considered to he a scaled version of the input signal plus some distortion term (I.e. $y=G*x+d$). If the distortion term is time-invariant and can be accurately predicted in advance, the small gain theorem allows the distortion term to be cancelled by subtracting the distortion from the PA input (i.e. $y=G*(x-d/G)+d=G*x$).

Most power amplifiers exhibit some behavior of the small gain theorem, as the error term is repeatable using the same input signal. However, some power amplifiers also exhibit memory effects. This is shown as hysteresis in the AM-AM and AM-PM curves (i.e. different AM-AM curve for the rising slope versus the descending slope) and is most likely due to electro-thermal effects (e.g. heating/cooling of power semiconductor components) and/or significant group delay across the frequency hand. As such, the amplifier can no longer be modeled as memory less, where the present output depends only on the present input. Memory less predistortion for a PA with memory often results in poor linearization performance. Accordingly, there Is a need to address the effect of amplifier nonlinearities combined with memory effects.

One type of RF power amplifier which offers improved efficiency is the envelope elimination and restoration (EER) amplifier. EER amplifiers are well known in the art and can achieve very highly efficient conversion of DC energy to RF energy for complex waveforms having a varying envelope. They operate by separately processing the envelope and phase information contained in a modulated input signal. The phase information is communicated to a power amplifier where it is amplified as a constant envelope signal. This permits such phase information to be amplified using highly efficient non-linear amplifiers. The envelope information contained in the input signal is restored to the phase information after the signal has been amplified.

Highly efficient EER amplifiers using Class E topologies are known to have poor linearity. This poor linearity causes significant amounts of signal distortion. For example, such distortion often arises from pulse-width modulator circuits that are used to control the output envelope voltage, and from switching non-linearities which exist in the circuit used for amplifying the phase information. Most of the distortion products associated with an EER amplifier can be corrected by predistorting the input waveform. However, construction of a practical predistortion signal processor has proved to be difficult in the case of EER amplifiers used to amplify wideband signals.

Another technique for linearizing the performance of an RF power amplifier i known as feedforward linearization. With feedforward linearization, a 180 degree signal combiner is typically used to subtract a distorted version of a signal from an undistorted version of the signal. The result is an error signal. The error signal can be amplified and then subtracted from an RF power amplifier output signal in order to remove the error from the output signal.

SUMMARY OF THE INVENTION

This invention addresses an adaptive approach to non-linear optimization of high-efficiency power amplifiers. More particularly, the invention concerns a method and apparatus for predistorting an input signal prior to amplification in an RF power amplifier. The method includes a number of steps, beginning with the step of isolating a plurality of sub-band signals. Each sub-band signal comprises a portion of the input signal. In particular, each sub-band signal represents a portion of the input signal contained in a predetermined frequency band defined within a bandwidth of the input signal. The isolating step can include selectively shifting a center frequency of each sub-band signal to coincide with a pass-band of a filter.

The method continues with the step of independently modifying at least one of an amplitude and a phase of each of the plurality of sub-band signals. The modification of the amplitude and/or phase is performed using a set of signal weighting parameters (weights) which are determined in an adaptive process. The weights which are used for modifying each of the sub-bands are advantageously selected to include complex weights, each comprising a real and an imaginary component. After this modification step, each of the sub-bands are summed together to obtain a predistorted input signal. According to one aspect of the invention, the method can also include selecting the RF power amplifier to be an envelope elimination and restoration type power amplifier.

The modifying step includes a linear correction of each sub-band signal, a non-linear correction of each sub-band signal, or both types of correction. The adaptive process is used to calculate the necessary weights for each sub-band signal for each type of correction. For example, a first set of weights can be calculated for a linear correction of each sub-hand signal, and a second set of the weights can be calculated for a non-linear correction of each sub-band signal. If the modifying step includes a non-linear correction, then such non-linear correction can include a pre-distortion of each sub-band to compensate amplitude modulation to amplitude modulation (AM-to-AM) type amplifier distortion, amplitude modulation to phase modulation (AM-to-PM) type distortion, or both types of distortion.

If the power amplifier also exhibit memory effects (which exhibit themselves as hysteresis in the AM-AM and AM-PM curves), then the adaptive sub-band predistorter, in accordance with the present invention, provides predistortion necessary to correct for nonlinearities combined with memory effects.

The input signal to which the predistortion is to be applied can be selected to be a complex (in-phase/quadrature-phase (I/Q) component) type signal. Further, the input signal can be chosen to have a wide-bandwidth (for example, a bandwidth that is on the order of 20% or more of the designed operating bandwidth of the amplifier). The input signal can have a time response that is significant with respect to the time delayed components of the distortion generation mechanism.

The invention also includes a system for predistorting an input signal prior to its amplification in an RF power amplifier. The system includes a sub-band isolator. The sub-band isolator includes signal processing components for isolating each one of a plurality sub-band signals into one of a plurality of sub-band channels. As explained above, each sub-band signal can comprise a portion of the input signal that is contained in a different predetermined frequency band within the overall bandwidth of the input signal. Each of the sub-band channels further comprises at least one signal weighting device. Each signal weighting device is responsive to a weight for independently modifying at least one of an amplitude and a phase of one of the plurality of sub-band signals. According to one aspect of the invention, the signal weighting device is responsive to the weights for modifying both the amplitude and the phase of each of the plurality of sub-band signals. In this regard, it will be understood that the weights described herein are advantageously complex weights comprising, a real and an imaginary component.

The system also includes an adaptive controller. The adaptive controller is responsive to an error signal for calculating the weights by means of an adaptive processing algorithm. The system also includes a summing device for summing each of the sub-band signals after the modifying step. The summing device is used to construct a predistorted input signal based on each of the modified sub-band signals.

The adaptive processor can be configured to calculate the weights for each signal weighting device for a linear correction of each sub-band signal, a non-linear correction of each sub-band signal, or both. In this regard it should foe understood that the system can include two or more signal weighting devices for each sub-band channel. If the system is designed for non-linear correction the adaptive processor is configured to calculate the weights necessary to correct for amplitude modulation to amplitude modulation (AM to AM) type amplifier distortion, amplitude modulation to phase modulation (AM to PM) type distortion, or both types of distortion. When using a sin(x)/x transversal filter to obtain the sub-band channels, each sub-band signal is orthogonal to each other, which is the mechanism that allows each sub-band weight to be modified independently. In other words, while one sub-band weight is being modified independently, the other sub-band weights' contribution to the overall mean-square-error (MSE) does not change.

DETAILED DESCRIPTION OF THE PREFERRED EMBODIMENTS

The invention will now be described more fully hereinafter with reference to accompanying drawings, in which illustrative embodiments of the invention are shown. This invention, may however, be embodied in many different forms and should not be construed as limited to the embodiments set forth herein. For example, the present invention can be embodied as a method, a data processing system, or a computer program product. Accordingly, the present invention can take the form as an entirely hardware embodiment, an entirely software embodiment, or a hardware/software embodiment.

The system described herein is intended for improving the linearity of an RF power amplifier, and more particularly for improving the linearity of RF power amplifiers exhibiting memory effects. As used herein, the term linear and/or linearity is used to describe the extent to which an RF amplifier is able to produce an amplified output signal which has an amplitude which is related to its input signal by some constant scaling factor over a defined dynamic operating range of the RF amplifier. Similarly, with regard to phase, the term linear or linearity is used to describe the degree to which such an RF amplifier can produce an amplified output signal which has a phase which is related to its input signal by some constant value over a defined dynamic operating range of the RF amplifier. The dynamic operating range, as that term is used herein, includes an expected range of signal amplitudes, and anticipated signal bandwidth, There is a continuing demand for amplifiers that operate more efficiently with unprecedented levels of linearity. Certain types of amplifiers, such as envelope elimination and restoration (EER) amplifiers, are known to have very high operating efficiency. However, these same amplifiers are also known to have poor linearity. According to an embodiment of the invention, the linearity of such amplifiers can be improved by using an improved adaptive pre-distortion technique.

Figure 1A:
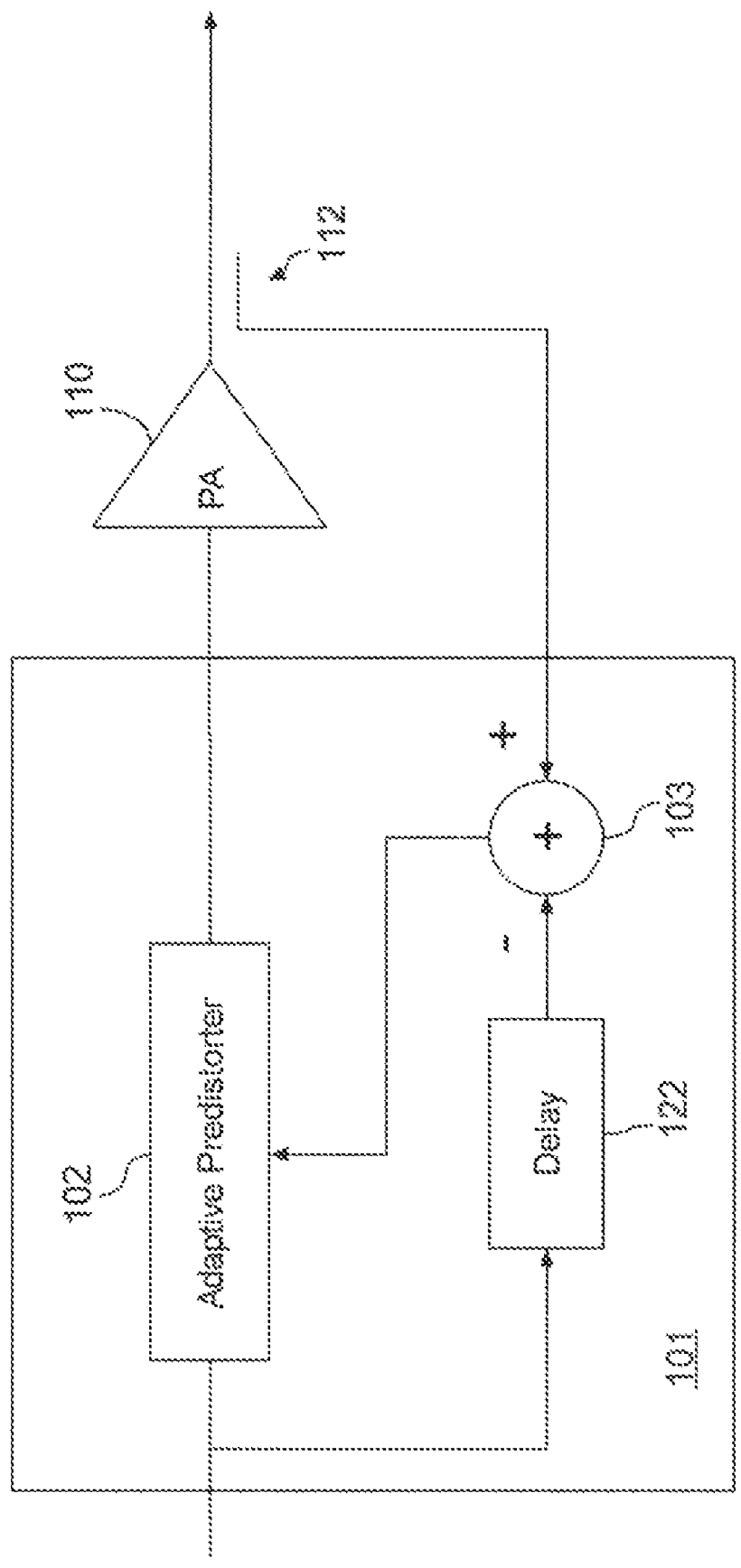
FIG. 1A is a block diagram of a conventional RF power amplifier arrangement which incorporates an adaptive predistortion system.

FIG. 1A illustrates the predistortion concept as implemented in an RF power amplifier system 100. A signal to be amplified is applied to a predistorter 102 associated with predistortion means 101, and then to the power amplifier 110 that is being linearized. A sample of the output of the power amplifier is taken, typically using a directional coupling mechanism 112. The original input signal is delayed by delay means 122 such that it is aligned approximately in time with the output sample. The delayed original and the sampled signal are subtracted in DSP 103, and the resulting error used by the predistorter 102 to modify its operation in a way that the error is minimized.

Figure 1B:
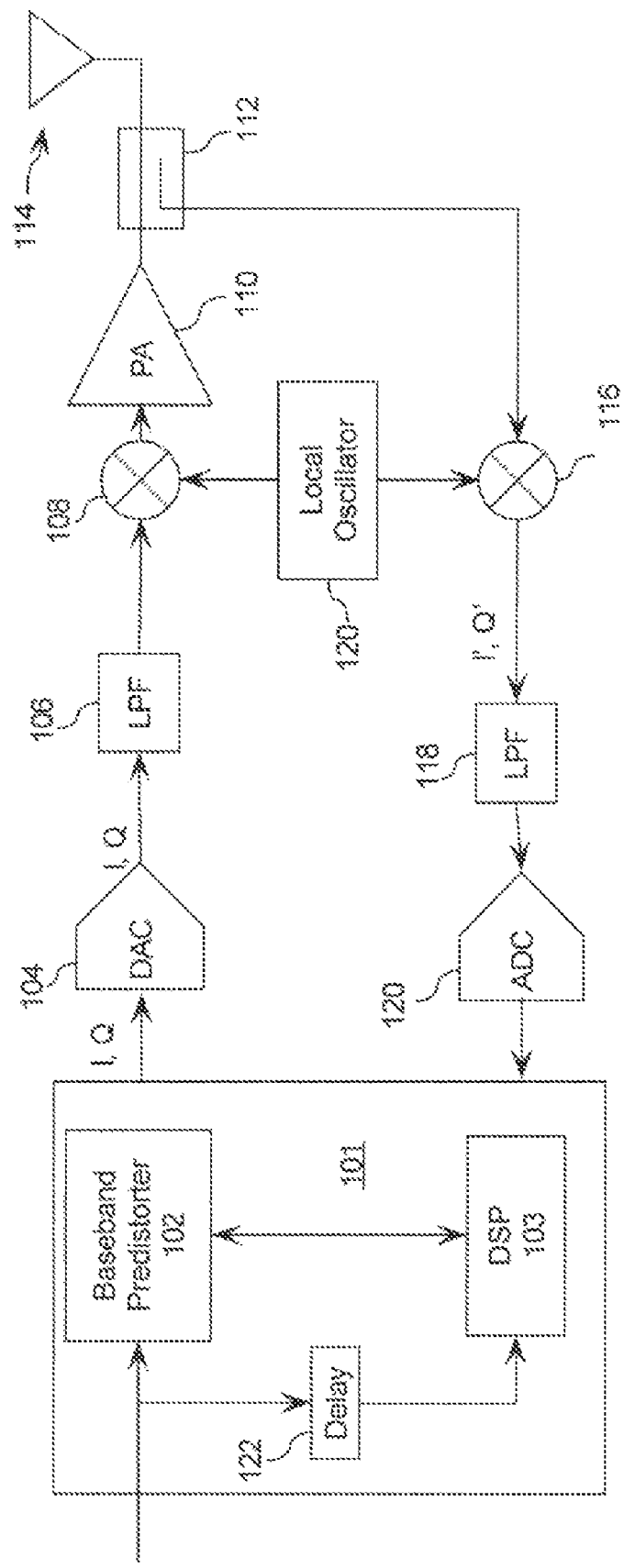
FIG. 1B is a more detailed block diagram of the RF power amplifier arrangement in FIG. 1A.

Referring now to FIG. 1B, there is shown a slightly more detailed block diagram of the RF power amplifier system 100. The RF power amplifier system uses a common IQ modulation technique which is often used with digital processes. Where an IQ modulation scheme is used, the "I" term refers to the "in-phase" component of the waveform, and the "G" term represents the quadrature component. IQ modulation will not be described here in detail because it is well known in the art.

The adaptive predistortion system 101 makes use of feedback from an output, of RF power amplifier (PA) 110. The baseband predistortion system 101 includes a baseband predistorter 102 and a DSP unit 103. The baseband predistorter modifies the I and Q components of the digital baseband signal to compensate for the non-linear operation of the PA 110. Stated differently, the I and Q components forming the digital baseband signal are "predistorted" prior to amplification so as to cause the PA 110 to have an output which is more linearly related to the input signal.

The predistorted I, Q, signal components output from the baseband predistorter 102 are communicated to the digital to analog converter (DAC) 104 and thereafter to a low pass filter (LPF) 108 for removal of unwanted high frequency signal components, The I, Q components are thereafter communicated to quadrature mixer 108. A local oscillator (LO) 120, provides an RF carrier signal to quadrature mixer 108, Thereafter, the composite predistorted waveform is communicated to the input of PA 110, where if is amplified and communicated to an antenna 114. A feedback signal is produced in an RF coupler 112 and converted to baseband I and Q signals by quadrature mixer 118. The mixer output is fed back to the DSP unit 103 through LPF 118 and analog to digital converter (ADC) 120, DSP 103 compares the feedback signal to the original I, Q component values which have been time delayed in delay line 122, it should be noted that the time delay may be performed by analog, digital, or DSP means. The DSP 103 uses the feedback signal and the original I, Q values to calculate an error signal. The error signal is then used in an adaptive algorithm to generate weighting factors for the I and Q components forming the digital baseband signal. These weighting factors are then used by the baseband predistorter 102.

Figure 2:
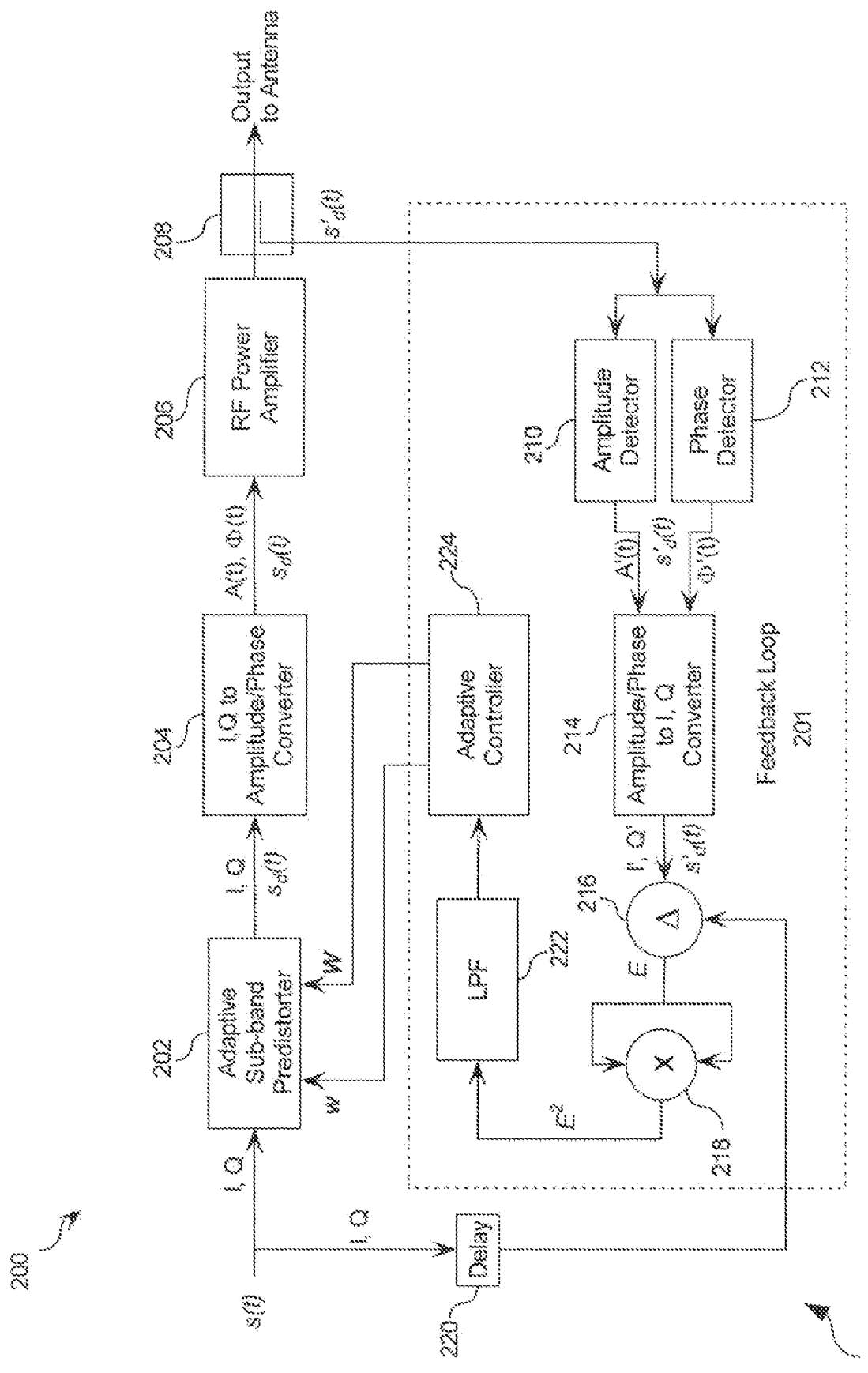
FIG. 2 is a block diagram that is useful for understanding an arrangement for an adaptive subband predistortion system.

Distortion affecting the performance of RF amplifiers can generally be characterized as either (1) non-linear distortion or (2) linear distortion. Non-linear distortion usually persists in the form of differential phase and gain errors at a particular frequency of operation. The most common types of non-linear distortion include envelope compression and incidental phase modulation. Envelope compression and incidental phase modulation occur when an RF amplifier's gain and/or phase response changes in response to a changing input signal amplitude. Such non-linear behaviors are sometimes referred to as AM-to-AM type amplifier distortion and AM-to-PM type amplifier distortion. In contrast, linear distortion is created by frequency response errors and group delay variations across the bandwidth of a particular RF channel FIG. 2 shows a simplified block diagram of an adaptive sub-band predistortion system 200 which is useful for correcting linear and non-linear distortion occurring in RF power amplifiers. The arrangement shown is particularly useful for correcting RF power amplifiers exhibiting memory based distortion (that is, distortion that depends on both current and previous values of the input signal). Referring now to FIG. 2, the system 200 processes an input signal s(t) prior to communicating such signal to an RF power amplifier. The input signal s(t) can be a complex signal to the extent that if can be comprised of in-phase (I) and quadrature-phase (Q) components. The I and Q components are communicated to an adaptive sub-band predistorter 202.

In the system shown in FIG. 2, an adaptive sub-band predistorter 202 provides adaptive predistortion for the I and Q signal components on a plurality of sub-bands. Each sub-band individually comprises a relatively small portion of the total frequency spectrum comprising a bandwidth of the complex signal s(t). Together, the sub-bands extend continuously over the entire bandwidth defined by the complex signal s(t). For example, if the entire bandwidth of the complex signal s(t) is 100 kHz, then 25 sub-bands could be provided, with each sub-band being 4 kHz wide. As will be explained in greater detail in relation to FIG. 3, the adaptive sub-band predistorter provides adaptive predistortion of each sub-band comprising the signal s(t). Since the individual sub-bands are orthogonal, the adaptive predistortion is applied to each sub-band independently. The individual sub-bands are then added back together at the output of the pre-distorter to re-form as $S_d(t)$ the original s(t) signal comprised of I and Q components, but with individually predistorted sub-bands.

Prior to communicating the signal s(t) to RF power amplifier 206, it can be necessary in certain systems to convert, the signal to an alternative format For example, EER type amplifiers have separate processing paths for phase and amplitude information. For these types of amplifiers, it is necessary to convert the I and Q signal components to amplitude and phase information before the signal can fee amplified. Assuming the inventive arrangements are intended for use with an EER type amplifier, the I and Q components output from the adaptive sub-band predistorter 202 are communicated to an I/Q-to-amplitude/phase (rectangular-to-polar) converter 204. The I/Q-to-A/P converter 204 converts the predistorted signal $s_d(t)$ (comprised of I and Q components) to an equivalent signal $s_d(t)$ which is defined by a time varying amplitude A(t) and a time varying phase angle $\Phi(t)$. Converters of this type are well known in the art. Accordingly, the I/Q-to-A/P converter 204 will not be described in detail herein.

Those skilled in the art will readily appreciate that various types of RF power amplifiers may require signal formats other than that which is required by an EER type amplifier. Accordingly, if the invention is intended to be used with such other types of amplifiers, it may be necessary to substitute a different type of converter in place of the I/Q-to-A/P converter 202. Thus it should be understood that invention is not limited to the use of I/Q-to-A/P converter 204. Instead, any other suitable converter can be used for a particular amplifier application, and all such alternative converters are intended to be included in the scope of the present invention.

After predistortion, the $s_d(t)$ signal is communicated to the RF power amplifier 206 where the signal is amplified and then output from the amplifier. The signal at the output of the amplifier is preferably $G \times s_d(t)$, where G is the amplifier's gain; however, all practical amplifiers exhibit distortion d such that the output of the amplifier is $s'_d(t) = G \times s_d(t) + d(t)$. Typically, the amplified $s'_d(t)$ signal will at this point be communicated to an antenna (not shown) for wireless transmission to a remote location. Coupler 208 preferably couples a small portion of the amplified $s'_d(t)$ signal from this output line to a feedback loop 201. The RF power amplifier can be any type of RF power amplifier. However, the present invention is particularly well suited for any one of a variety of highly efficient amplifiers that are known to be non-linear.

Such amplifiers include EER type amplifiers, which are well known in the art. However, the invention is not limited in this regard.

Feedback loop 201 includes an amplitude detector 210 and a phase detector 212 which are respectively designed to extract information concerning the amplitude A'(t) and phase angle Φ'(t) of the output signal from RF power amplifier 206. Phase and amplitude defector circuits are well known in the art and therefore will not be described here in detail. However, it will be appreciated that the amplitude A'(t) and phase angle Φ'(t) will differ somewhat from the values of amplitude A(f) and phase angle Φ(t) due to the non-linearities associated with RF power amplifier 206. The amplitude A'(t) and phase angle Φ'(t) are communicated to an amplitude/phase-to-I/Q (polar-to-rectangular) converter 214. The A/P-to-I/G converter 214 will use the amplitude and phase Information to calculate corresponding values of I' and Q'. A/P-to-I/Q converters are well known in the art and therefore will not be described here in detail. Alternatively, the I/Q signal could have been constructed directly by use of a quadrature mixer and local oscillator. Thus it should be understood that the present invention is not limited to the use of A/P-to-I/Q converter 214, amplitude detector 210, or phase defector 212.

The I' and Q' values are communicated to a subtraction block 216. Also communicated to the subtraction block 216 are the original values of I and Q associated with the signal s(t). An appropriate delay 220 is provided to chronologically align the I and Q components from the signal s(t) with the I' and Q' components from the signal $s'_d(t)$. Stated differently, the amplified $s'_d(t)$ signal (which has been distorted by RF power amplifier 206) is compared to the original s(t) signal in block 216. The respective differences between these component values represent non-linearities introduced by the RF power amplifier. These non-linearities can be expressed as error term E. The error term E is multiplied by itself in multiplication block 218 to calculate $E^2$. Taking the square of the error term converts the error term to a power level difference (as opposed to a voltage difference). The squared error signal is subsequently communicated to a low pass filter (LPF) 222 to remove any noise and unwanted high frequency components in the error signal. The output is then communicated to the adaptive controller 224.

The adaptive controller 224 calculates two basic types of weighting values which are used in the adaptive sub-band predistorter 202. A first type of weighting factor w is used in the adaptive sub-band predistorter 202 for adaptive AM-to-AM predistortion and adaptive AM-to-PM predistortion. A second type of weighting factor W is used for adaptive predistortion of I and Q components in the component sub-band predistorter 202.

Figure 3:
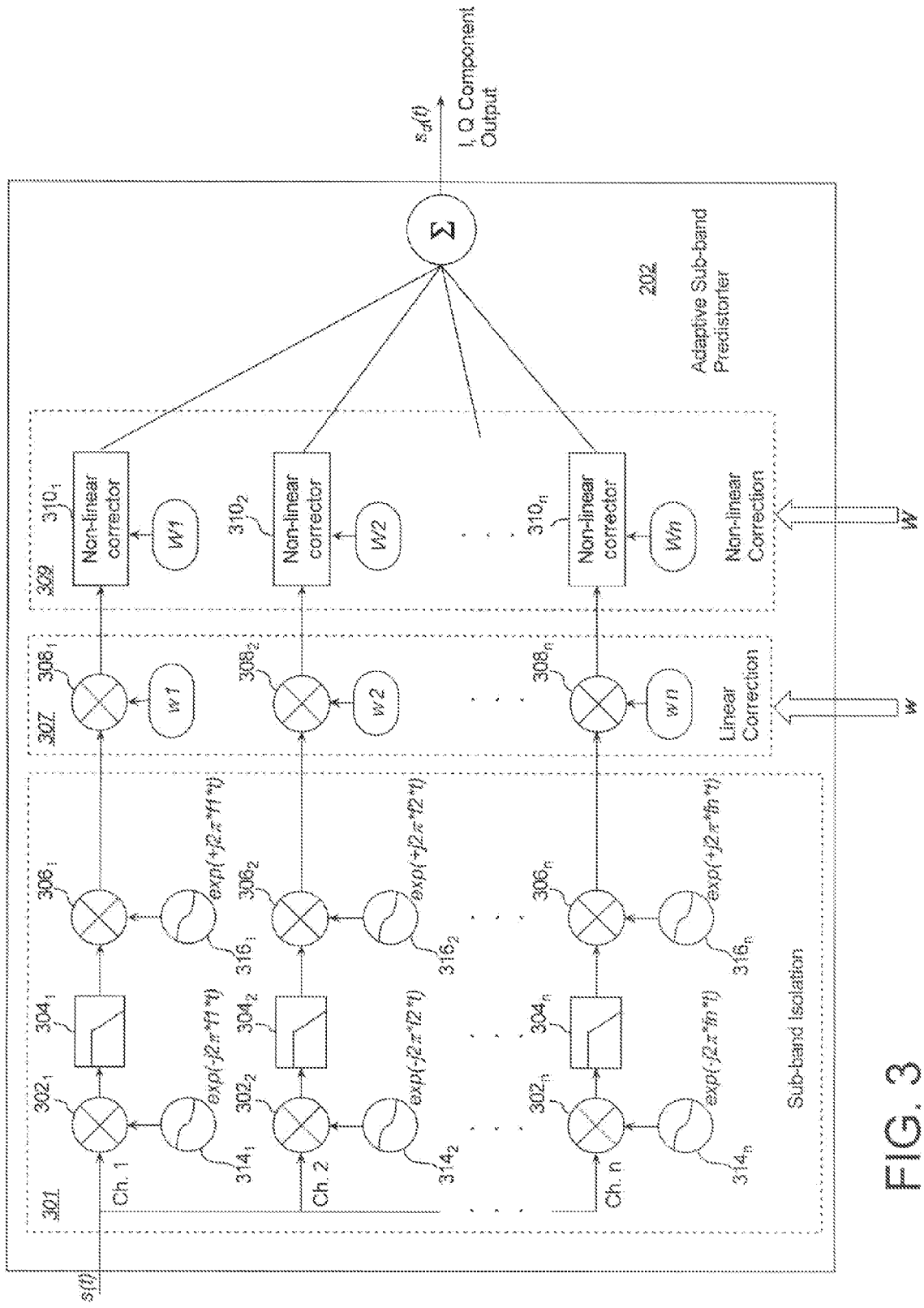
FIG. 3 is a detailed block diagram that is useful for understanding the operation of the adaptive subband predistorter block in FIG. 2.

Referring now to FIG. 3, there is shown a more detailed block diagram of the adaptive sub-band predistorter 202. It can be observed that adaptive sub-band predistorter 202 is comprised of three main functional blocks. These main functional blocks include a sub-band isolation section 301, a linear correction section 307, and a non-linear correction section 309.

The sub-band isolation section 301 isolates the I and Q component signal into a plurality of individual sub-bands 1 through n so that each sub-band can be processed independently. The linear correction section 307 is an adaptive linear filter which provides adaptive predistortion of I and Q component signals in each sub-band. The linear correction section is provided to compensate for linear distortion associated with amplification of wideband signals. For example, such linear distortion can result from variations in group delay among the different sub-bands comprising the I and Q components of the signal. Such group delay variations are common in broadband analog signals processed by the RF power amplifier 110. The linear correction section 307 compensates for such linear distortion with the use of adaptive predistortion processing. The non-linear correction section 309 is also an adaptive filter section. However, non-linear correction section 309 is provided to compensate for non-linear distortion that occurs in the RF power amplifier 110. Each of these three sections 301, 307, 309 will now be described in greater detail.

The purpose of the sub-band isolation section 301 is to isolate a plurality of sub-bands comprising the I and Q component signal. For example, a set of 50 sub-bands, each 1 kHz wide, could be obtained from a 50 kHz wide I and Q component signal. Any suitable approach can be utilized to achieve this result. The sub-band isolation section 301 illustrates one possible arrangement for achieving this result. However, if should be understood that the invention is not limited in this regard. Any other suitable arrangement can also be used, provided that the result is a set of n sub-bands which together include the entire frequency spectrum of a wideband input complex (I and Q component) signal.

Referring again to FIG. 3, it can fee observed that the sub-band isolation section 301 is arranged to communicate an incoming I and Q component signal to each of a plurality of channels 1 through n. Any suitable means can be used for providing the I, Q component signal to each of the channels 1 through n. For example, a digital multiplexer (not shown) or memory buffer could be used for this purpose.

According to a preferred embodiment of the invention, the sub-band isolation section 301 is further comprised of a linear equalization filter. The linear equalization filter is realized in the frequency domain with a bank of sin(x)/x filters. Exact equalization can be achieved at "n" points across a bandwidth for an "n" filter bank, and nearly orthogonal operation in each of the narrow bands. This is in contrast to a typical transversal filter tap which affects the entire band simultaneously. Additionally, the filter's "inverse transformation" from the frequency domain is a simple summation. Consequently, this is an economical compensation network to implement In the present invention, each sin(x)/x filter for a channel n is implemented using mixers $302_n$, $306_n$, and a low pass filter $304_n$.

The output of each sin(x)/x filter is multiplied by a complex (IQ) weight W(q×N). In this way, a desired transfer function can be realized at "n" points, one for each sin(x)/x filter, across a band of interest. This near-orthogonality of control is possible since ail other filters exhibit zero response at a given filters main lobe. An adaptive controller 224 in a feedback circuit can then tailor the response of the filter bank to minimize error between the power amplifier's output and the desired signal input.

The implementation of the bank of sin(x)/x filters will now be described in more detail. The incoming I and Q component signal for each of a plurality of channels 1 through n is respectively communicated to a mixer 3021 through $302_n$ provided for each channel. Each mixer $302_1$ through $302_n$ is respectively provided with a local oscillator $314_1$ through $314_n$ which generates a complex local oscillator signal for each channel. The complex local oscillator signal consists of real and imaginary component outputs. The purpose of the mixer and local oscillator in each channel is to frequency translate the I, Q component signal. In each channel 1 through n, the center frequency fn of a particular sub-hand processed by a particular channel is shifted or down-converted to zero Hz, after which it can be isolated by using a low pass filter $304_1$ through $304_n$. In order to accomplish this result, the frequency of each local oscillator $314_i$ through $314_n$ is unique to a particular channel. For example, in channel 1, the complex local oscillator signal can be expressed as $\exp(-j2\pi*f_1*t)$. For the nth channel, the complex local oscillator signal can be expressed as $\exp(-j2\pi*f_n*t)$.

In each mixer $302_1$ through $302_n$, the real and imaginary components comprising the local oscillator signal are multiplied by the incoming I and Q components of the input signal. In each channel n, the local oscillator frequency is selected so that the multiplication process shifts the frequency of the incoming I and Q component signal so that a center frequency $f_n$ of a particular sub-band is shifted to DC or zero Hertz. For example, in channel 1, the sub-band contained in the incoming I and Q component signal that is centered on $f_1$ is shifted so that the new center frequency of the sub-band is at DC or zero Hertz. In channel 2, the same incoming I and Q component signal is shifted so that the sub-band centered on $f_2$ is shifted to DC or zero Hertz.

Those skilled in the art will readily appreciate how the required frequency for each local oscillator can be determined in order to perform the necessary frequency shifting or down-conversion as described herein. For example, assume a baseband input I, Q signal that is 50 kHz wide, centered on 0 Hertz (DC). The input signal thus would extend 25 kHz above and below zero Hertz. To isolate a particular sub-band of the I, Q signal with a center frequency at, say, 10 kHz, then the local oscillator frequency could be selected which is that same frequency, 10 kHz. Stated differently, the complex local oscillator waveform can be expressed as $\exp(-j2\pi*f_n*t)$, where $f_n=10$ kHz. Such a local oscillator signal would produce a sub-band at the output of the mixer $302_1$ in which the original center frequency of 10 KHz is shifted to a center frequency of zero Hertz (DC). A similar process could be used for each channel 1 through n to shift a center frequency of each desired sub-band down to zero Hertz.

Once the downshifting process is complete, the I and Q component signal in each channel n is respectively communicated to the low pass filter $304_1$ through $304_n$. The low pass filter will in each channel filter out all frequency components, except for those frequency components comprising a particular sub-band n of the original I and Q signal. Thereafter, a mixer $306_1$ through $306_n$ is used in each channel 1 through n to shift each particular sub-band 1 through n back to its original center frequency $f_n$. For example, if the sub-band n originally had a center frequency at 10 kHz, then the output of the mixer $306n$ will also have a center frequency located at 10 kHz. This frequency shift or up-conversion is accomplished in each channel 1 through n by using local oscillators $316_1$ through $316_n$ respectively to generate a complex local oscillator signal at the desired center frequency. For example, in channel 1, the complex local oscillator signal generated fey local oscillator $316_1$ can be expressed as $\exp(j2\pi*f_1*t)$. For the nth channel, the complex local oscillator signal can be expressed as $\exp(j2\pi*f_n*t)$.

The resulting output from each mixer $306_1$ through $306_n$ is an isolated one of the n sub-bands. Each sub-band comprises a selected frequency band of the original I and Q component signal. Each sub-band will have a bandwidth equal to the original bandwidth of the I, Q component signal divided by the number of sub-bands n. For example, in the case of an I and Q component signal having a 50 kHz bandwidth divided into 50 sub-hands (n=50), each sub-hand would be 1 kHz wide.

After each sub-band has been isolated m the sub-band isolation section 301 each of the n sub-bands is communicated to the linear correction section 307. Linear correction section 307 is an adaptive linear filter in which multipliers $308_1$ through $308_n$ are used to selectively adjust the magnitude and phase of the I and Q components in a particular sub-band based on a set of complex filter weights w1 through wn. The complex filter weights w1 through wn are determined by adaptive controller 224.

Before detailed discussion of the proposed method, the related topics of non-linear distortion and averaging time need to be addressed. Ideally, adaptive optimization addresses a "static" problem, and the associated "expected values" are approached with infinite integration time. The objective is to integrate over a time period that is shorter than the rate at which parameters to be corrected will vary, yet long enough to resolve weak eigenvalues that may substantially affect the result.

The complex weights w1 through wn may he determined by a number of different algorithms. According to one embodiment, the adaptive controller 224 can use a closed-loop weight-perturbational gradient following algorithm for optimizing the weights. A closed-loop weight-perturbational gradient following algorithm has the major advantage of circumventing the need for functional knowledge of the distortion mechanism. Direct covariance matrix inverse with recursive updating would be preferable otherwise, but involves estimating and "linearizing" unknown mechanisms leading to observed waveform distortion. Without such required knowledge, those direct methods are not easily applied.

The weight perturbational adaptive controller calculates partial derivatives of the error power with respect to individual weights, then moves in a direction to minimize the error (negative gradient). Since expected value error power, hence a partial derivative of this power, is equivalency calculated in either the time or frequency domain, if is immaterial as to whether the weights control a frequency domain or time domain component's input. Derivatives calculated in "real-time" in the time domain using definition of the partial derivative work out "automatically" for controlling a frequency domain weight.

In accordance with a non-limiting example of the present invention, the $\sin(x)/x$ filter bank may be realized from a moving average filter (also know as a box-car filter or an FIR filter with all weights equal to unity). Since the $\sin(x)/x$ filter may be realized as a multi-fixed-tap transversal filter, it is possible to use a transversal filter representation of the frequency domain weighting and combining system. However, the group of delayed inputs forming a given filter must be weighted by a common factor and derivatives must be calculated by perturbing all of the "fixed" tap weights at once. The system non-linearity precludes analytical representation of the derivatives. In actual operation if is highly desirable to both implement and perturb a single complex weight applying to a given $\sin(x)/x$ filter. Advantageously, using the same $\sin(x)/x$ filter for each sub-hand provides orthogonality between each sub-band signal.

Since the $\sin(x)/x$ filters may be represented by a moving average transversal filter, the input to the transmitter may be expressed as $$x_0(t)=h_0(t)*s(t)$$

$$x_1(t)=h_1(t)*s(t)$$

$$x_2(t)=h_2(t)*s(t)$$

$$\ldots$$

$$x_{N-1}(t)=h_{N-1}(t)*s(t)$$

where the function s(t) designates the signal output from the non-linear predistortion weighting and the asterisk denotes convolution (application of the frequency domain filters). The filters $h_0$ to $h_{N-1}$ are orthogonal band-pass filters used to isolate the individual subbands.

Equivalents, $$x_1(t) = (h_0 * (s(t) \cdot e^{-j*2*pi*f_1*l})) \cdot e^{j*2*pi*f_1*l}$$

where the filter $h_0$ is the sin(x)/x lowpass filter, i=0 . . N-1, $e^{-j*2*pi*f_1*l}$ has the effect of downconverting the signal to zero frequency, and $e^{j*2*pi*f_1*l}$ has the effect of upconverting the signal back to its original frequency before downconversion. Thus, each subband is downconverted to zero frequency, lowpass filtered, and then subsequently re-upconverted to form a matrix of isolated orthogonal subbands.

Transmitter output is $$y(t) = F[s_d(t)] = F[W^T x(t)]$$

where T represents a complex transpose operation, $W^T$ is the complex weight matrix, and F[] is the power amplifier function.

System error follows, $$e(t) = y(t) - s(t) = F[W^T x(t)] - s(t)$$

The expected value of the error power may be minimized by solving for the weight vector that solves $$\nabla_W = \left\{ \frac{1}{T} \int_t^{t+1} e^2(t) \, dt \right\} = 0$$

where the gradient operator is $$\nabla_W = \frac{\partial}{\partial W_1} + \frac{\partial}{\partial W_2} + \ldots + \frac{\partial}{\partial W_W} = 0$$

The integration time T should be sufficiently long that the integral produces the expected value of the error function, where the expected value integration function is denoted by E[]. In addition, the order of integration and differentiation will be reversed, Justified because W is quasi-static. This leads to $$2E[e(t)\nabla_W\{F[W^T x(t)]\}] = 0$$

At this point, a direct solution is not possible since the nonlinear function F[] is not known. As an alternative, optimization may be addressed by a gradient following process, subject to a number of conditions that may or may not be satisfied. The most important of these require that F(W) be single valued and have a single minimum. The algorithm consists of assessing the local gradient of the error surface with respect to the weights, then moving downward (negative of the gradient) at a rate proportional to the scalar k toward the minimum. Mathematically, this is $$\frac{dW}{dt} = -k \nabla_W \left\{ \frac{1}{R} \int_t^{t+1} e^2(t) \, dt \right\}$$

where k is the convergence value.

Expressing the error using the available transmitter output and signal input, we have $$\frac{dW}{dt} = -k \nabla_W \{E[[y(t) - s(t)]^2]\}$$

Approximating the derivatives with finite differences, one can get an expression for adjustment of a given weight, Wi $$\frac{\Delta W_i}{\Delta t} = -k \frac{\Delta\{E[[y(t) - s(t)]^2]\}}{\Delta W_i} \bigg|_{W_{i \neq j} = constant}$$

This is evaluated by $$\frac{\Delta W_i}{\Delta t} = -k \frac{\{E[[y(t, W + \delta W_i) - s(t)]^2 - [y(t, W - \delta W_i) - s(t)]^2]\}}{\Delta W_t} \bigg|_{W_{i \neq j} = constant}$$

Functionally, this means that the expected value of the error is to be evaluated at a given weight state, while a single weight is perturbed slightly both positively and negatively, providing a measure of the error gradient with respect to that weight.

Range of convergence value k can be greatly reduced using a stability analysis (not provided here) that shows that the maximum value of k(Δt) must be less than E(xTx), which is $NE[s^2(t)]$. Substituting K=k(Δt) and rearranging $$\Delta W_i = \frac{K}{NE\{s^2(t)\}}$$

$$\frac{\{E[[y(t, W + \delta W_i) - s(t)]^2 - [y(t, W - \delta W_i) - s(t)]^2]\}}{\Delta W_t} \bigg|_{W_{i \neq j} = constant}$$

The iterated weight vector at time (t+1) is then $$W_{t+1} = W_t = \frac{K}{NE\{s^2(t)\}}$$

$$\frac{\{E[[y(t, W + \delta W_i) - s(t)]^2 - [y(t, W - \delta W_i) - s(t)]^2]\}}{\Delta W_t} \bigg|_{W_{i \neq j} = constant}$$

The closed-loop weight-perturbational gradient following algorithm begins by initializing all the weights to 1+0i (this is complex number notation for an I component of 1 and a Q component of zero, where i denotes the imaginary part). A representative signal is passed through the system, and the error term E (FIG. 2) is obtained. The real part of the first weight w1 is then increased a small amount Δ, and the error term $\epsilon_1$ for that condition obtained. The real part of the weight wi is then decreased by a small amount Δ, and a second error term $\epsilon_2$ obtained. The error terms are then combined mathematically to provide an amount by which to change the weight that will reduce the error term. For example, if $\epsilon_1 < \epsilon_2$ then w1 can be updated by Re(w1)=Re(w1)+Δ/2, else Re(w1)=Re(w1)−Δ/2, where Re(x) denotes the "real part of x". This change is applied to the real part of w1, and the resulting error term obtained. Next the imaginary part of the w1 is increased, then decreased, with the error term obtained for each case. These error terms are then combined as described above to provide an amount by which to change the imaginary part of w1. This change is applied to the imaginary part of the weight, and the resulting error term obtained. This process is repeated for w1, each iteration decreasing Δ by Δ=Δ/2 until the error is minimized for this weight.

The same process is then followed successively for ml, w3, etc. until ail weights have been optimized for minimum error. The entire process may then be repeated, making appropriate changes to the amount each weight is changed up or down. The minimum mean square error (MSE) can be achieved in this manner by modifying each weight individually because each of the sub-bands are orthogonal. The adaptive controller 224 that implements this technique is known as a "weight perturbational" adaptive controller in accordance with a non-limiting example of the present invention. Alternatively, the weights may be calculated directly using a least-mean-square (LMS) or recursive-least-square algorithm, The application of different complex weights to different sub-bands in the linear correction section 307 is advantageous for use with certain types of highly efficient RF power amplifiers, particularly when such amplifiers are used to amplify signals having a relatively wide bandwidth compared to the overall design operating bandwidth of the amplifier. As used herein, the term relatively wide bandwidth refers to signals having a bandwidth which is more than about 20% of the operating bandwidth of an RF amplifier. Another way of looking at this considers the amount of time it takes a signal to propagate through the amplifier relative to the amount of time the fastest variations in the signal take. A given amplifier will have a certain amount of time it takes for the signal it is amplifying to propagate from the amplifiers input to its output. Distortion tends to be exacerbated when the time period of variations in the input signal are significantly less than the amplifier propagation delay. Such signals produce a memory effect in the RF power amplifier, which is caused by interference among signals input to the RF power amplifier over a given time period. Different frequency bands will propagate through the RF power amplifier at slightly different rates. The result can be distortion of particular frequency bands. In effect, the output signal from the RF amplifier at a particular moment in time is affected by the signals input into the amplifier at an earlier time. In other words, the current output depends on both past and present inputs. The gain and phase characteristics of the RF amplifier are therefore dependent, to some extent on the frequency content of the signals that are communicated to the amplifier.

From the foregoing, it can be understood that distortion in a relatively wideband signal can be produced in the RF amplifier 206 because of variations in the time delay as different frequency components comprising the wideband signal are propagated through the amplifier. In the adaptive sub-band predistorter 202, if the bandwidth of the individual sub-bands is sufficiently less than the total signal bandwidth, then phase shifts or adjustments to phase are equivalent to time shifting. Accordingly, the linear correction section 307 can be used to provide predistortion of the I, Q signal components to compensate for variations in the time delay of various sub-bands as they propagate through the RF power amplifier.

Following the application of the complex weights w1 through wn to each sub-band in the linear correction section 307, each sub-band is communicated to the non-linear correction section 309. The non-linear correction section includes non-linear correctors $310_1$ through $310_n$. Each non-linear corrector $310_1$ through $310_n$ can apply to the I, Q component signal a function dependent on weights W1 through Wn to provide predistortion to correct non-linearities in the RF amplifier, in particular, such non-linear correctors $310_1$ through $310_n$ can be used to pre-distort each sub-band to correct errors caused by AM-to-AM distortion, AM-to-PM distortion, or both. Selectively applying such predistortion to each sob-band of the I, Q signal is advantageous as compared to simply applying a constant predistortion across an entire band of signals. This is because the characteristics of an amplifier with regard to AM-to-AM distortion, and AM-to-PM distortion can vary somewhat over the bandwidth of a relatively wideband signal. Accordingly, a single predistortion value applied over an entire bandwidth of a relatively wide bandwidth signal will not generally give an optimal result for the purpose of compensating for amplifier non-linearities.

Non-linear correction weights W1 through Wn may be determined by a weight perturbational adaptive controller such as described above. A weight perturbational adaptive controller calculates partial derivatives of the error power with respect to individual weights, then moves in a direction to minimize the error, that is to say, it moves the weights along a negative error gradient.

The output of each non-linear corrector $310_1$ through $310_n$ is communicated to a summing device 312 which sums each sub-band channel to reconstruct an I, Q signal that includes the entire bandwidth of the original I, Q signal. The reconstructed I, Q component signal is then communicated to the I/Q-to-A/P converter block 204 as previously described in relation to FIG. 2.

From the foregoing discussion regarding FIGS. 1-3, It should be understood that the inventive arrangements can also include a method for adaptive sub-band predistortion. For example, the method can include isolating a plurality of n sub-bands which together comprise an I, Q component signal. The method can also include determining a set of n complex weights using an adaptive algorithm designed to minimize an error signal. The error signal can be determined by comparing an output of the amplifier to a time delayed version of the input signal of the amplifier. A linear correction step can include applying the set of n complex weights respectively to the set of n sub-bands so as to correct for distortion occurring in the RF amplifier.

The method can continue with a non-linear correction step. The non-linear correction step can include calculating a set of weights using an adaptive algorithm designed to minimize an error signal. The error signal can be determined by comparing an output of the amplifier to a time delayed version of an input signal of the amplifier. The non-linear correction step can also include a predistortion step in which the input signal of the RF amplifier is predistorted to compensate for AM-to-AM and/or AM-to-PM amplifier distortion known to occur in the amplifier.

The signal processing and control functions associated with the present invention can be realized in one computer system. Alternatively, the present invention can be realized in several interconnected computer systems. Any kind of computer system or other apparatus adapted for carrying out the methods described herein is suited. A typical combination of hardware and software can be an RF power amplifier coupled to digital signal processing equipment, and/or a general-purpose computer system. The general-purpose computer system can have a computer program that can control the computer system such that it carries out the methods described herein.

Aspects of the present invention can take the form of a computer program product on a computer-usable storage medium (for example, a hard disk, a CD-ROM, or semiconductor memory). The computer-usable storage medium can have computer-usable program code embodied in the medium. The term computer program product, as used herein, refers to a device comprised of all the features enabling the implementation of the methods described herein. Computer program, software application, computer software routine, and/or other variants-of these terms, in the present context, mean any expression, in any language, code, or notation, of a set of instructions intended to cause a system having an information processing capability to perform a particular function either directly or after either or both of the following: a)

conversion to another language, code, or notation; or b) reproduction in a different material form.

We claim:

1. A method for predistorting an input signal prior to amplification in an RF power amplifier, comprising:
   receiving in a predistortion system an input signal for an RF amplifier;
   isolating a plurality of sub-band signals, each comprising a portion of said input signal contained in a different predetermined frequency band within a bandwidth of said input signal;
   adaptively determining a set of weights in an adaptive process comprising a closed loop weight-perturbational gradient following algorithm based on an amplified output signal generated by said RF amplifier;
   independently modifying at least one of an amplitude and a phase of each of said plurality of sub-band signals using said set of weights;
   summing each of said sub-band signals after said modifying step to obtain a predistorted input signal; and
   communicating said predistortion input signal to said RF amplifier.

2. The method according to claim 1, further comprising selecting said modifying step to include at least one of a linear correction of each said sub-band signal and a non-linear correction of each said sub-band signal.

3. The method according to claim 2, further comprising selecting said modifying step to include a linear correction of each said sub-band signal and a non-linear correction of each said sub-band signal.

4. The method according to claim 2, further comprising selecting said non-linear correction to include a pre-distortion of each said sub-band to compensate for at least one of amplitude modulation to amplitude modulation (AM to AM) type amplifier distortion, and amplitude modulation to phase modulation (AM to PM) type distortion, in said RF amplifier.

5. The method according to claim 1, further comprising selecting said adaptive process to calculate a first set of said weights for a linear correction of each said sub-band signal, and a second set of said weights for a non-linear correction of each said sub-band signal.

6. The method according to claim 1, wherein said modifying step comprises modifying said amplitude and said phase of each of said plurality of sub-band signals.

7. The method according to claim 1, wherein said weights are complex weights comprising a real and an imaginary component.

8. The method according to claim 1, further comprising selecting said input signal to be an I, Q component signal.

9. The method according to claim 1, wherein said isolating step is comprised of selectively shifting a center frequency of each said sub-band signal to coincide with a pass-band of a filter.

10. The method according to claim 1, wherein said isolating step includes extracting said sub-band signals using a bank of filters, each comprising a sin(x)/x filter function.

11. A system for predistorting an input signal prior to amplification in an RF power amplifier, comprising:
    a sub-band isolator comprising a plurality of sub-band channels, each configured for isolating one of a plurality sub-band signals, each said sub-band signal comprising a portion of said input signal contained in a different predetermined frequency band within a bandwidth of said input signal;
    each of said sub-band channels further comprising at least one signal weighting device, each said signal weighting device responsive to an assigned weight for independently modifying at least one of an amplitude and a phase of each of said plurality of sub-band signals;
    an adaptive controller responsive to an error signal for calculating said weights using an adaptive process comprised of a closed loop weight-perturbational gradient following algorithm; and
    summing means for summing each of said sub-band signals after said modifying step to obtain a predistorted input signal.

12. The system according to claim 11, further comprising an adaptive processor configured to calculate said weights for each said signal weighting device for at least one of a linear correction of each said sub-band signal and a non-linear correction of each said sub-band signal.

13. The system according to claim 12, wherein at least two signal weighting devices are provided for each said sub-band channel, and further comprising an adaptive processor configured to calculate said weights for each said signal weighting device for a linear correction of each said sub-band signal and a non-linear correction of each said sub-band signal.

14. The system according to claim 12, wherein said adaptive processor is configured for determining said set of weights for each said signal weighting device to compensate for at least one of amplitude modulation to amplitude modulation (AM to AM) type amplifier distortion, and amplitude modulation to phase modulation (AM to PM) type distortion.

15. The system according to claim 11, wherein said signal weighting device is responsive to said weights for modifying said amplitude and said phase of each of said plurality of sub-band signals.

16. The system according to claim 11, wherein said weights are complex weights comprising a real and an imaginary component.

17. The system according to claim 11, wherein each of said plurality of sub-band channels comprises a filter having a sin(x)/x filter function for extracting one of said plurality of sub-band signals.

* * * * *